United States Patent

Satomi et al.

[11] Patent Number: 5,277,991
[45] Date of Patent: Jan. 11, 1994

[54] MAGNETORESISTIVE MATERIALS

[75] Inventors: Mitsuo Satomi, Katano; Hiroshi Sakakima, Tsuzuki, both of Japan

[73] Assignee: Matsushita Electric Industrial Co., Ltd., Osaka, Japan

[21] Appl. No.: 840,821

[22] Filed: Feb. 25, 1992

[30] Foreign Application Priority Data

| Mar. 8, 1991 | [JP] | Japan | 3-043305 |
| May 2, 1991 | [JP] | Japan | 3-100673 |
| Jun. 20, 1991 | [JP] | Japan | 3-148474 |
| Jun. 20, 1991 | [JP] | Japan | 3-148475 |

[51] Int. Cl.$^5$ ............. B32B 15/01; B32B 15/20; H01F 1/00; H01F 10/08
[52] U.S. Cl. ................. 428/611; 428/635; 428/928; 428/900; 428/675; 428/676
[58] Field of Search ......... 428/635, 611, 928, 678, 428/675, 676, 694

[56] References Cited

U.S. PATENT DOCUMENTS 4,476,454 10/1984 Aboaf et al. ............... 360/113

FOREIGN PATENT DOCUMENTS 0335488 10/1989 European Pat. Off. .
0406060 1/1991 European Pat. Off. .
1-238106 9/1989 Japan ................... 428/635
2-23681 1/1990 Japan ................... 428/635

OTHER PUBLICATIONS

Baibich, et al "Giant Magnetoresistance of (001)Fe/(001)Cr Magnetic Superlattices", Physical Review Letters, vol. 61, No. 21 pp. 2472-2475, Nov. 1988.
Yamamoto, et al "Large Magnetoresistance of Field-Induced Multilayers", Preliminary Manuscript, Applied Physical Society Meeting, Autumn, 1990.

Primary Examiner—Gregory A. Heller
Assistant Examiner—Valerie Ann Lund
Attorney, Agent, or Firm—Stevens, Davis, Miller & Mosher

[57] ABSTRACT

Magnetoresistive material exhibiting a large ratio of resistance on the application of a low magnetic field applied at room temperature to the material. The material is composed of layers made primarily from Co with a thickness of 10-100Å, a second magnetic layer having a thickness of 10-100Å, both of which layers are alternately laminated through a non-magnetic layer composed mainly of copper having a thickness of about 20Å.

5 Claims, 3 Drawing Sheets

\* ANY ONE OF THE THREE
LAYERS MAY BE DISPOSED
AS THE OUTER MOST LAYERS

\* ANY ONE OF THE TWO
LAYERS MAY BE DISPOSED
AS THE OUTER MOST LAYERS

MAGNETORESISTIVE MATERIALS

BACKGROUND OF THE INVENTION

1. Field of the Invention

The present invention relates to magnetoresistive materials for magnetoresistance (MR) heads, sensors or the like.

2. Description of the Related Art

Magnetoresistance sensors (hereinafter referred to as MR sensors) and magnetoresistance type heads (hereinafter referred to as MR heads) using magnetoresistive elements have been under development up to now. Permalloys of $Ni_{0.8}Fe_{0.2}$ are primarily used for the magnetic bodies. However, the ratio of resistance change (hereinafter referred to as $\Delta R/R$) of these materials is approximately 2.5%. To obtain magnetoresistive elements having greater sensitivity, elements having a large $\Delta R/R$ are required. A Ni-Co alloy film containing 60 to 80 atomic % of Ni is available as one of these elements. Even if this film is used, the value of $\Delta R/R$ is approximately 5.8% at maximum.

It was discovered recently that a large magnetoresistance occurs when using a Fe/Cr, artificial superlattice film (Physical Review Letter Vol. 61, p2472, 1988). With this material, however, a large $\Delta R/R$ cannot be obtained unless a magnetic field of more than 10 kOe is applied. Therefore it is difficult to put this film into practical use.

There was a report that a resistance change of about 10% as regards (when applying a magnetic field of 3 kOe) $\Delta R/R$ was observed, by using an ultra-high vacuum deposition apparatus, on an artificial superlattice film composed of a $Ni_{0.8}Fe_{0.2}(30Å)/Cu(50Å)/Co(30Å)/Cu(50Å) \times 15$ layers (Preliminary Manuscript, Applied Physical Society Meeting, Autumn, 1990). However, there are problems in that a high-cost ultra-high vacuum deposition apparatus is required to produce films and also a large $\Delta R/R$ cannot be obtained unless a large magnetic field of approximately 3 kOe is applied.

SUMMARY OF THE INVENTION

An object of the present invention is to obtain a magnetoresistive material which make it possible to produce magnetoresistive elements having a large $\Delta R/R$ by a practical, low magnetic field. The magnetoresistive materials of the present invention have constitution as shown below, that are formed by using a sputtering apparatus:

(1) A magnetoresistive material comprising a first magnetic thin-film layer mainly composed of Co with a thickness of 10 to 100Å, and a second magnetic thin-film layer mainly composed of $Ni_xFe_yCo_z$ with a thickness of 10 to 100Å, both of the layers being alternately laminated through a non-magnetic metallic thin-film layer sandwiched therebetween mainly composed of Cu with a thickness of 10 to 35Å, where X, Y and Z are: $0.6 \leq X \leq 0.9$, $0 \leq Y \leq 0.3$, and $0.01 \leq Z \leq 0.3$, respectively;

(2) A magnetoresistive material comprising a first magnetic thin-film layer mainly composed of Co with a thickness of 10 to 100Å, and a second magnetic thin-film layer mainly composed of Ni-Co and containing 50 or more atomic % of Ni, with a thickness of 10 to 100Å, both of the layers being alternately laminated through a non-magnetic metallic thin-film layer sandwiched therebetween mainly composed of Cu with a thickness of 10 to 35Å;

(3) A magneto-resistive material comprising magnetic metallic thin-film layers mainly composed of $Ni_xFe_yCo_z$ with a thickness of 10 to 100Å and non-magnetic metallic thin-film layers mainly composed of Cu with a thickness of 10 to 25Å, both of the layers being laminated, wherein X, Y and Z are, by atomic composition ratio, $0.6 \leq X \leq 0.9$, $0 \leq Y \leq 0.3$, and $0.01 \leq Z \leq 0.3$, respectively; and (4) A magnetoresistive material comprising magnetic metallic thin-film layers mainly composed of Ni-Co containing Ni of 50 atomic % or more with a thickness of 10 to 100Å and non-magnetic metallic thin-film layers mainly composed of Cu with a thickness of 10 to 25Å, both of the layers being laminated.

The aforementioned and other objects, features and advantages of the present invention will become clear when reference is made to the following description of the preferred embodiments of the present invention, together with reference to the accompanying drawings

DESCRIPTION OF THE PREFERRED EMBODIMENTS

Figure 1:
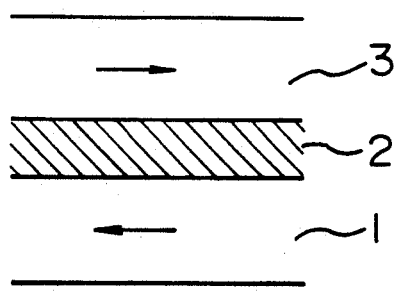
FIG. 1 is a view which illustrates the directions of the spin orientations of each magnetic layer of a magnetoresistive material of the present invention when the applied magnetic field is weak.

It is believed that the material of the present invention shows a large magnetoresistance because an antiparallel state is achieved between the two adjacent magnetic metallic thin-film layers 1 and 3 separated by a non-magnetic metallic thin-film layer 2, as shown in FIG. 1. If there is no non-magnetic metallic thin-film layer, the magnetic thin-film layers are ferromagnetically connected parallelly, so that an anti-parallel state cannot be obtained with the result that a large magnetoresistance cannot be achieved. The constitution of the present invention will now be explained. The magnetic metallic thin-film layer 1 in the first, second, third and fourth embodiments contains Co as its main component and shows a semi-hard magnetic property. The magnetic metallic thin-film layer 3 is a soft magnetic material of Ni-rich Ni-Fe-Co or Ni-Co. In embodiments 5, 6, 7 and 8, the magnetoresistive materials comprise the magnetic metallic thin-film layers 1 and 3 both of which are Ni-rich Ni-Fe-Co or Ni-Co soft magnetic materials. The non-magnetic metallic thin-film layer 2 herein used is composed of Cu.

First Embodiment

Figure 2:
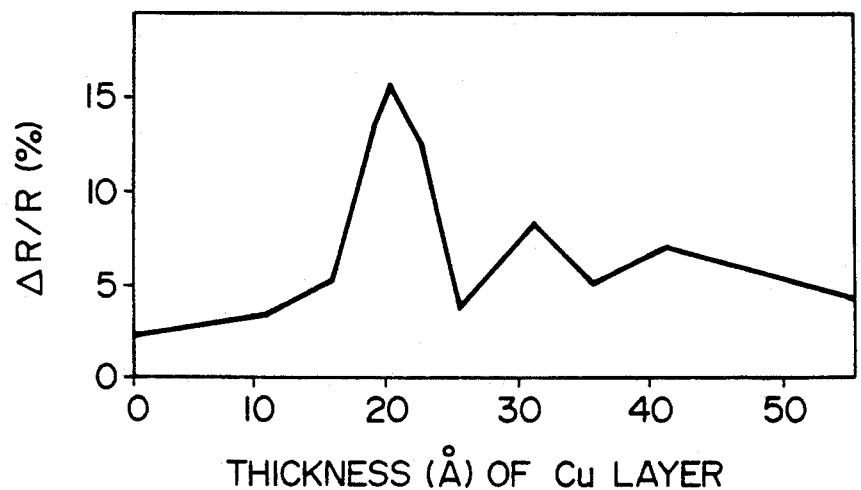
FIG. 2 is a view, according to a first embodiment, which illustrates the dependence of the MR change ratio of the magnetoresistive material upon the thickness of a Cu layer.

In FIG. 1, the magnetic metallic thin-film layer 1 is mainly composed of Co and shows a semi-hard magnetic property. The magnetic metallic thin-film layer 3 is mainly composed of Ni-rich $Ni_XFe_YCo_Z$. $Ni_XFe_YCo_Z$ whose magneto-striction is small and which shows a soft magnetic property is one in which X, Y and Z, expressed by atomic composition ratios, satisfying $0.6 \leq X \leq 0.9$, $0 \leq Y \leq 0.3$, and $0.01 \leq Z \leq 0.3$, and more preferably $0.6 \leq X \leq 0.9$, $0 < Y \leq 0.25$, and $0 < Z \leq 0.25$. When the magnetoresistance effect is taken into consideration, $\Delta R/R$ of the Ni-Fe film is smaller than the Ni-Fe-Co film, and therefore Z is larger than 0.01. A typical one which satisfies these conditions is $Ni_{0.8}Fe_{0.15}Co_{0.05}$. Nb, Mo, Cr, W, Ru or the like may be added to Ni-Fe-Co film to improve the soft magnetic property, and wear and corrosion resistances. If the thickness of each of the magnetic metallic thin-film layers are smaller than 10Å, there occurs in the magnetic metallic thin-film layer such a problem as magnetization at room temperature is reduced due to a decrease in Curie temperature. Further, since a magnetoresistive element practically used has a total film layer thickness of several hundred Å in order to utilize a lamination effect as in the present invention, it is necessary to make each magnetic thin-film layer have a thickness not more than 100Å. Preferably, the thickness of the magnetic metallic thin-film layer is 10 to 100Å. The non-magnetic metallic thin-film layer 2 sandwiched between these magnetic thin films is necessary to hardly react with a NI-FE-CO type magnetic thin film at the interface defined by them and to be non-magnetic. Cu is preferable for the film 2 and the most preferable thickness of a Cu layer is about 20Å. The $\Delta R/R$ shows the RKKY-like oscillation depending upon the thickness of the Cu layer, as shown in FIG. 2, the reason for it being not clear. When the thickness of Cu layer exceeds 35Å, the magnetoresistance decreases. Therefore, it is preferable for the thickness of the Cu layer to be not greater than 25Å. The advantages of the present invention will now be explained with reference to specific embodiments.

Figure 6:
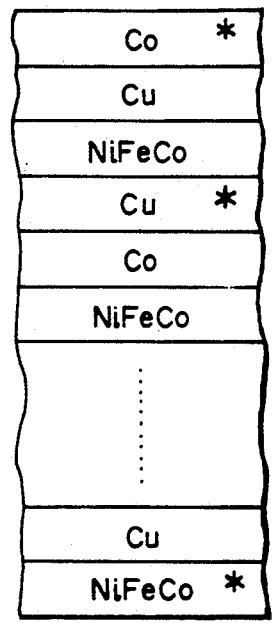
FIG. 6 is a view, according to the first embodiment, which illustrates a magnetoresistant materials produced.

There was used a multi-RF sputtering apparatus with Co, Cu and $Ni_{0.8}Fe_{0.15}Co_{0.05}$ as targets, the inside of which sputtering apparatus was exhausted to $2 \times 10^{-7}$ Torr. Thereafter, Ar gas was introduced into the apparatus and the apparatus was set at $8 \times 10^{-3}$ Torr. A magnetoresistive material, having a constitution shown below, formed in sequency by sputtering, was produced on a glass substrate, as shown in FIG. 6.

[Co(30)/Cu(0 to 55/NiFeCo(30)/Cu(0 to 55)×N where parentheses indicate a thickness (Å) and N is a repetition number, which varies from 12 to 33. The thickness of each film was controlled by adjusting the sputtering period of time and by using a shutter. A film having the repetition number (N) of 12 to 33 and a total thickness of approximately 0.2 μm was produced. The characteristics of the produced magnetoresistive material are shown in FIG. 2. $\Delta R/R$ was measured by applying a magnetic field of 300 Oe.

As is clear from FIG. 2, it became evident that the $\Delta R/R$ has a local maximum value when the Cu layer is about 20Å thick. Next, the $\Delta R/R$ has a second local maximum value when the Cu layer is about 30Å thick. The $\Delta R/R$ has a third local maximum value when the Cu layer is about 40Å thick. Therefore, to obtain a maximum $\Delta R/R$, it is most preferable that the Cu layer is about 20Å thick In this embodiment, Co and NiFeCo layers were disposed as the outermost layers, however, any one of Co, NiFeCo, and Cu layers may be disposed as the outer most layers. Further, the number of layers laminated depends upon a kind of a product to be produced. For example, in a case of a film of 500Å in thickness used in a MR sensor, N is preferably 5 or so.

Second Embodiment

By using an RF sputtering apparatus and Co, Cu and $Ni_{0.8}Fe_{0.15}Co_{0.05}$ as targets, a film, in which the thickness of the Cu layer was constant and the thicknesses of the magnetic layers were changed, was produced by sputtering in the same manner as in the first embodiment. The characteristics of the produced film are shown in Table 1. The $\Delta R/R$ of a comparison sample having the same constitution as that of No. B but using $Ni_{0.8}Fe_{0.2}$ which is a material used in the prior art in place of $Ni_{0.8}Fe_{0.15}Co_{0.05}$ was 8.8%, while the $\Delta R/R$ of a specimen of the invention using $Ni_{0.8}Fe_{0.19}Co_{0.01}$ was 12%. In view of this fact, Co is indispensable from the point of view of, obtaining larger $\Delta R/R$.

TABLE 1

| No. | Co (Å) | Cu (Å) | NiFeCo (Å) | $\Delta R/R$ (%) |
|---|---|---|---|---|
| A | 20 | 20 | 20 | 15.8 |
| B | 30 | 20 | 30 | 15.5 |
| C | 50 | 20 | 50 | 10.6 |
| D | 70 | 20 | 70 | 9.5 |

Third Embodiment

Figure 3:
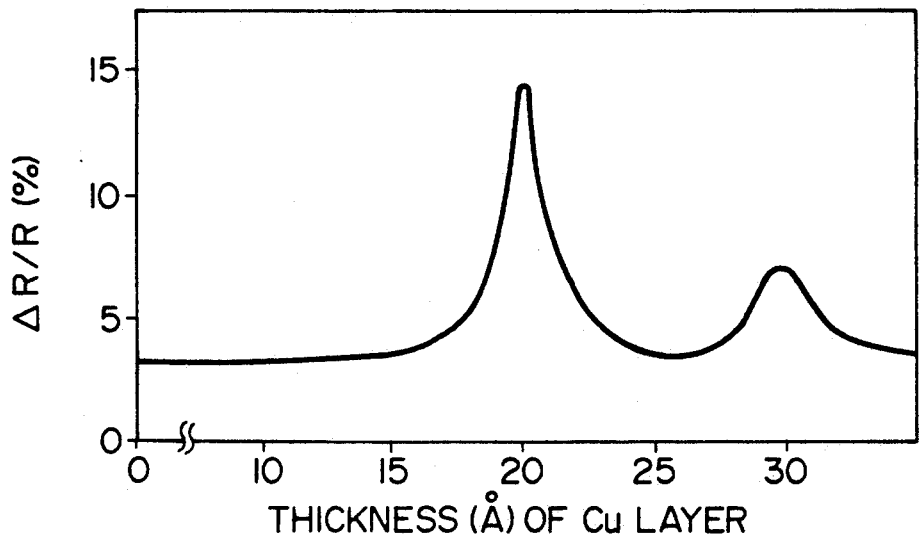
FIG. 3 is a view, according to a third embodiment, which illustrates the dependence of the MR change ratio of the magnetoresistive material upon the thickness of a Cu layer.

In FIG. 1, the magnetic metallic thin-film layer 1 has Co as its main component and shows a semihard magnetic property. The Ni-rich Ni-Co type alloys of the magnetic metallic thin-film layer 3 has Ni and Co as its main components. If Ni is smaller than 50% or less by an atomic composition ratio, a large $\Delta R/R$ is not obtained unless a larger magnetic field is applied. When the ratio of Ni is 90% or more, a large $\Delta R/R$ is not obtained either. A typical one which satisfies these conditions is $Ni_{0.8}Co_{0.2}$. A small amount of elements may be added to the Ni-Co film to improve the soft magnetic property, and wear and corrosion resistances. In a case where the thickness of each of these magnetic metallic thin-film layers is less than 10Å, there occurs in the metallic thin-film layers such a problem that magnetization at room temperature is reduced due to a decrease in Curie temperature. Further, since a practically used magnetoresistive element has a total thickness of several hundred Å, it is necessary for each magnetic metallic thin-film layer to have a thickness of not more than 100Å in order to produce a lamination effect as in the present invention. Therefore, the thickness of the magnetic metallic thin-film layer is preferably 10 to 100Å. The non-magnetic metallic thin-film layer sandwiched between these magnetic thin films is required to hardly react with a Ni-Fe-Co type magnetic thin film at the interface defined by them and to be non-magnetic. Cu is preferable for the film 2 and the most preferable thickness of a Cu layer is approximately 20Å. The $\Delta R/R$ shows a RKKY-like oscillation depending upon the thickness of the Cu layer, as shown in FIG. 3, though the reason for it is not clear. When it exceeds 35Å, the magnetoresistance decreases. Therefore, it is preferable for the thickness of the Cu layer to be not greater than 25Å.

There were used a multi-RF sputtering apparatus and Co, Cu and $Ni_{0.8}Co_{0.2}$ as targets, the inside of which sputtering apparatus was exhausted to $2 \times 10^{-7}$ Torr. Thereafter, Ar gas was introduced into the apparatus and the apparatus gas set at $6 \times 10^{-3}$ Torr A magnetoresistive material, having a composition shown below, formed in sequence by sputtering, was produced on a glass substrate:

[Co(30)/Cu(0 to 35)/NiCo(30)/Cu(0 to 35))]×N where parentheses indicate a thickness (Å) and N is a repetition number. The thickness of each film was controlled by adjusting the sputtering period of time and by using a shutter. A film having the repetition number (N) of 15 to 33 and a total thickness of approximately 0.2 μm was produced. The characteristics of the produced magnetoresistive material are shown in FIG. 3. ΔR/R was measured by applying a magnetic field of 300 Oe.

As is clear from FIG. 3, it became evident that the ΔR/R has a local maximum value when the Cu layer is about 20Å thick. Next, the ΔR/R has the second local maximum value when the Cu layer is about 30Å thick. Therefore, to obtain a maximum ΔR/R, it is preferable that the Cu layer be about 20Å thick.

Fourth Embodiment

By using an RF sputtering apparatus and Co, Cu and $Ni_{0.8}Co_{0.2}$ as targets, a film, in which the thickness of the Cu layer was constant and the thicknesses of the magnetic layers were changed, was produced by sputtering in the same manner as in the third embodiment. The characteristics of the produced films are shown in Table 2. For reference, the ΔR/R of a comparison sample having the same composition as that of No. B but using $Ni_{0.8}Fe_{0.2}$ which is a material used in the prior art in place of $Ni_{0.8}Co_{0.2}$ was 8.8%. In view of this fact, Ni-Co type alloys are excellent from the point of view of obtaining larger ΔR/R.

TABLE 2

| No. | Co (Å) | Cu (Å) | NiCo (Å) | ΔR/R (%) |
|---|---|---|---|---|
| A | 20 | 20 | 20 | 14.5 |
| B | 30 | 20 | 30 | 14.6 |
| C | 50 | 20 | 50 | 9.6 |
| D | 70 | 20 | 70 | 8.9 |

Fifth Embodiment

In FIG. 1, the magnetic metallic thin-film layers 1 and 3 are films having Ni-rich $Ni_xFe_yCo_z$ as their main components. $Ni_xFe_yCo_z$ shows a small magnetostriction, a soft magnetic property and magnetoresistance in a case where X, Y and Z, expressed by atomic composition ratios, satisfy $0.6 \leq X \leq 0.9$, $0 \leq Y \leq 0.3$, and $0 \leq Z \leq 0.3$, respectively. When magnetoresistance is taken into consideration, the ΔR/R of the entire film is larger for Ni-Fe-Co types than for Ni-Fe types, and $Z \leq 0.01$ is preferred. A typical one which satisfies these conditions is $Ni_{0.8}Fe_{0.15}Co_{0.05}$. Nb, Mo, Cr, W, Ru or the like may be added to improve the soft magnetic property, and wear and corrosion resistances. In a case where the thickness of each of these magnetic thin-film layers is less than 10Å, there occurs in the magnetic thin-film layers such a problem as magnetization at room temperature is reduced due to a decrease in Curie temperature. Further, since a practically used magnetoresistive element has a total thickness of several hundred Å in order to utilize a lamination effect as in the present invention, the thickness of each magnetic thin-film layer is necessary to be not greater than 100Å. Preferably, the thicknesses of the magnetic metallic thin-film layers is 10 to 100Å. The non-magnetic metallic thin-film layer 2 sandwiched between these magnetic thin films is required to hardly react with a Ni-Fe-Co type magnetic thin film at the interface thereof and be non-magnetic. Cu is preferable for the film 2 and the most preferable thickness of a Cu layer is approximately 20Å. If the thickness of a Cu layer is smaller than 10Å and the Cu layer becomes no more continuous film, the two adjacent magnetic thin film layers are magnetically coupled, and it is difficult to achieve a state in which the spins between the magnetic layers are anti-parallel as shown in FIG. 1. The ΔR/R shows a RKKY-like oscillation depending upon the thickness of the Cu layer, though the reason for it is not clear. Therefore, it is preferable for the thickness of the Cu layer to be not more than 25Å. The advantages of the present invention will now be explained with reference to specific embodiments.

Figure 7:
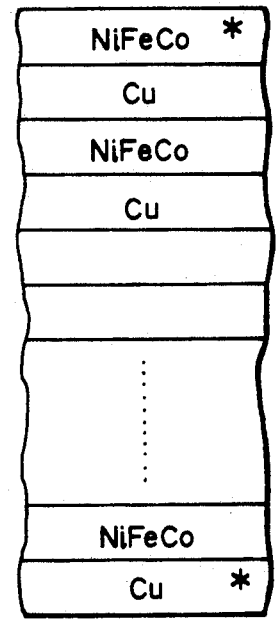
FIG. 7 is a view of a magnetoresistant material produced in the fifth embodiment.

There were a multi-RF sputtering apparatus and Co, Cu and $Ni_{0.8}Fe_{0.15}Co_{0.05}$ as targets, the inside of which sputtering apparatus was exhausted to $2 \times 10^{-7}$ Torr. Thereafter, Ar gas was introduced into the apparatus and the apparatus was set at $8 \times 10^{-3}$ Torr. A magnetoresistive material having a composition shown below, formed in sequence by sputtering, was produced on a glass substrate as shown in FIG. 7.

[NiFeCo(30)/Cu(10 to 32.5)]×N where parentheses indicate a thickness (Å), which varies from 32 to 50. The thickness of each film was controlled by adjusting the sputtering period of time and by using a shutter. A film having the repetition number (N) of 32 to 50 and a total thickness of approximately 0.2 μm was produced.

Figure 4:
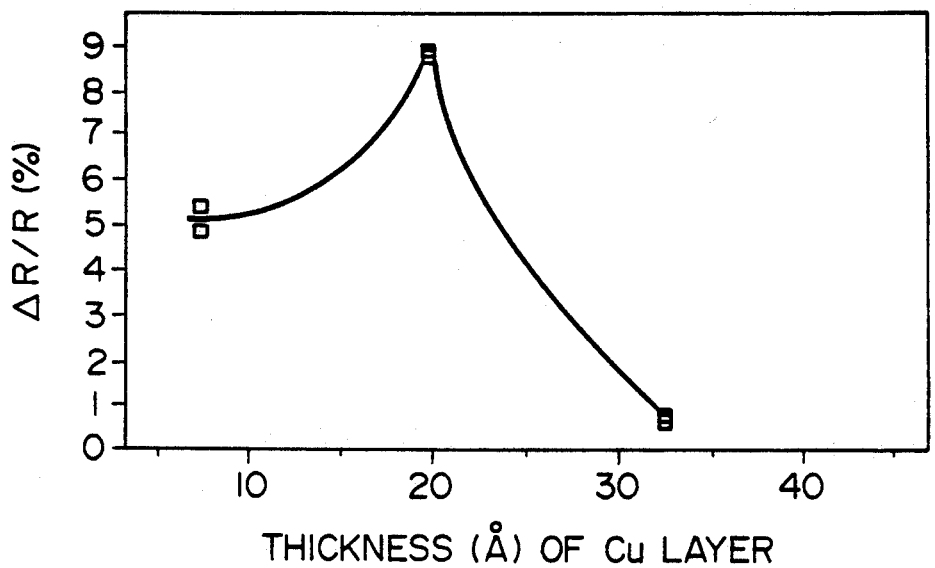
FIG. 4 is a view, according to a fifth embodiment, which illustrates the dependence of the MR change ratio of the magnetoresistive material upon the thickness of a Cu layer.

The characteristics of the magnetoresistive material produced are shown in FIG. 4. ΔR/R was measured by applying an applied magnetic field or 300 Oe. As is clear from FIG. 4, the ΔR/R has a local maximum value when the Cu layer is about 20Å thick. It became evident that the thicker the Cu layer is above 20Å thick, the more the ΔR/R decreases. Therefore, to obtain a maximum ΔR/R, it is preferable that the Cu layer is about 20Å thick.

Sixth Embodiment

By using an RF sputtering apparatus and Co, Cu and $Ni_{0.8}Fe_{0.15}Co_{0.05}$ as targets, a film, in which the thickness of the Cu layer was constant and the thicknesses of the magnetic layers were changed, was produced by sputtering in the same manner as in the fifth embodiment. The characteristics of the produced film are shown in Table 3. For reference, regarding a comparison sample having the same constitution construction as that of No. B and having Co in place of $Ni_{0.8}Fe_{0.1.5}Co_{0.05}$, the ΔR/R value of the comparison sample was 5%.

TABLE 3

| No. | Cu (Å) | NiFeCo (Å) | ΔR/R (%) |
|---|---|---|---|
| A | 20 | 20 | 8.5 |
| B | 20 | 30 | 9.0 |
| C | 20 | 50 | 7.5 |
| D | 20 | 70 | 6.5 |

Seventh Embodiment

In FIG. 1, the magnetic metallic thin-film layers 1 and 3 are films composed of Ni-Co containing at least 50 atomic % of Ni with a thickness of 10 to 100Å. If the ratio of Ni is smaller than this quantity, there occurs such a problem as it is difficult to obtain a soft magnetic property. A typical one which satisfies these conditions is $Ni_{0.8}Fe_{0.15}Co_{0.05}$. Nb, Mo, Cr, W, Ru Or the like may be added to improve the soft magnetic property, and wear and corrosion resistances. In a case where the thickness of each of these magnetic thin-film layers is less than 10Å, there occurs in the magnetic thin film such a problem as magnetization at room temperature is reduced due to a decrease in Curie temperature. Further, since a practically used magnetoresistive element has a total thickness of several hundred Å in order to utilize a lamination effect as in the present invention, each magnetic thin-film layer is necessary to be not greater than 100Å. Preferably, the thickness of the magnetic metallic thin-film layer is 10 to 100Å. The non-magnetic metallic thin-film layer 2 sandwiched between these magnetic thin films is required to hardly react with a Ni-Fe-Co type magnetic thin film at the interface therebetween and to be non-magnetic. Cu is preferable for the film 2 and the most preferable thickness of a Cu layer is approximately 20Å. If the thickness of Cu is smaller than 10Å and the Cu layer becomes no more continuous film, two adjacent magnetic thin-film layers are magnetically connected, and it becomes difficult to obtain such a state as the spins between the magnetic layers are anti-parallel as shown in FIG. 1. The ΔR/R value showed an RKKY-like oscillation depending upon the thickness of the Cu layer, though the reason for it is not clear. Therefore, in a case where the magnetoresistance up to the first local maximum peak is used, it is preferable for the thickness of the Cu layer to be not greater than 25Å. The advantages of the present invention will now be explained with reference to specific embodiments.

There were used a multi-RF sputtering apparatus and Co, Cu and $Ni_{0.8}Co_{0.2}$ as targets, the inside of which sputtering apparatus was exhausted to $2 \times 10^{-7}$ Torr. Thereafter, Ar gas was introduced into the apparatus and the apparatus was set at $8 \times 10^{-3}$ Torr A magnetoresistive material, having a composition shown below, formed in sequence by sputtering, was produced on a glass substrate:

[NiCo(30)/Cu(10 to 45)]×N where parentheses indicate a thickness (Å) and N is a repetition number. The thickness of each film was controlled by adjusting the sputtering period of time and by using a shutter. A film having a repetition number (N) of 27-50 and a total thickness of approximately 0.2 μm was produced.

Figure 5:
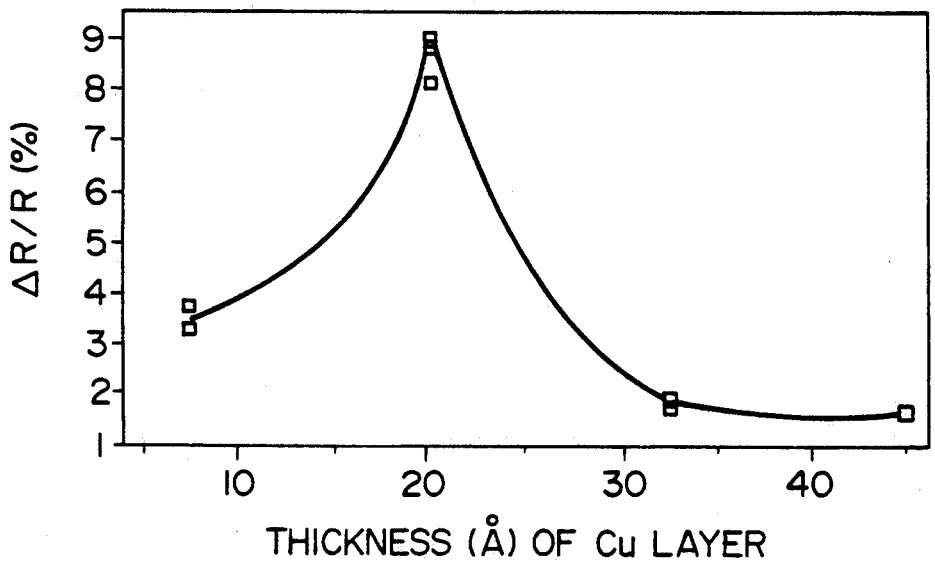
FIG. 5 is a view, according to a seventh embodiment, which illustrates the dependence of the MR change ratio of the magnetoresistive material upon the thickness of a Cu layer.

The characteristics of the produced magnetoresistive material are shown in FIG. 5. ΔR/R was measured by applying magnetic field of 300 Oe. As is clear from FIG. 5, it became evident that the ΔR/R has a local maximum value when the Cu layer is about 20Å thick, and as the thickness of the layer increases more than 20Å, the magnetoresistance decreases. Therefore, to obtain a maximum ΔR/R, it is preferable that the Cu layer is about 20Å thick.

Eighth Embodiment

By using an RF sputtering apparatus and Co, Cu and $Ni_{0.8}Co_{0.2}$ as targets, a film, in which the thickness of the Cu layer was constant and the thicknesses of the magnetic layers were changed, was produced by sputtering in the same manner as in the seventh embodiment. The characteristics of the produced film are shown in Table 4. The ΔR/R of a comparison sample having the same constitution (construction) as that of No. B and using Co in place of $Ni_{0.8}Co_{0.2}$ was 5%.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included with the spirit and scope of the claims. The following claims are to be accorded a broad interpretation, so as to encompass all such modifications and equivalent structures and functions.

TABLE 4

| No. | Cu (Å) | Ni—Co (Å) | ΔR/R (%) |
|---|---|---|---|
| A | 20 | 20 | 8.5 |
| B | 20 | 30 | 9.0 |
| C | 20 | 50 | 7.5 |
| D | 20 | 70 | 6.5 |

What is claimed is:

1. A magnetoresistive material comprising first magnetic thin film layers mainly composed of Co with a thickness of 10 to 100Å, and second magnetic thin film layers mainly composed of $Ni_xFe_yCo_z$ in which X, Y and Z are $0.6 \leq X \leq 0.9$, $0 \leq Y \leq 0.3$, and $0.01 \leq Z \leq 0.3$ respectively, with a thickness of 10 to 100Å, both of the first and second layers being alternately laminated through a non-magnetic metallic thin film layer sandwiched therebetween, said non-magnetic layer mainly composed of Cu having a thickness of about 20Å whereby the ratio of the resistance change, ΔR/R, of the magnetoresistive material is a local maximum in a plot of ΔR/R versus the thickness of the Cu layer.

2. A magnetoresistive material comprising first magnetic thin film layers mainly composed of Co with a thickness of 10 to 100Å, and second magnetic thin film layers mainly composed of $Ni_xFe_yCo_z$ in which X, Y and Z are $0.6 \leq X \leq 0.9$, $0 \leq Y \leq 0.25$, $0.01 \leq Z \leq 0.25$, respectively, and having a thickness of 10 to 100Å, both of the first and second layers being alternately laminated through a non-magnetic metallic thin film layer sandwiched therebetween, said non-magnetic layer mainly composed of Cu having a thickness of about 20Å whereby the ratio of the resistance change, ΔR/R, of the magnetoresistive material is a local maximum in a plot of ΔR/R versus the thickness of the Cu layer.

3. A magnetoresistive material comprising first magnetic thin film layers mainly composed of Co what a thickness of 10 to 100Å, and second magnetic thin film layers mainly composed of Ni-Co containing not less than 50 atomic % of Ni with a thickness of 10 to 100Å, both of said first and second layers being alternately laminated through a non-magnetic metallic thin film layer sandwiched therebetween, said non-magnetic layer mainly composed of Cu with a thickness of about 20Å whereby the ratio of the resistance change, $\Delta R/R$, of the magnetoresistive material is a local maximum in a plot of $\Delta R/R$ versus the thickness of the Cu layer.

4. A magnetoresistive material comprising magnetic metallic thin film layers mainly composed of $Ni_xFe_yCo_z$ with a thickness of 10 to 100Å, and non-magnetic metallic thin film layers mainly composed of Cu with thickness of about 20Å whereby the ratio of the resistance change, $\Delta R/R$, of the magnetoresistive material is a local maximum in a plot of $\Delta R/R$ versus the thickness of the Cu layer, both of the two kinds of layers being alternately laminated, wherein X, Y and Z are, by atomic composition ratios, $0.6 \leq X \leq 0.9$, $0 \leq Y \leq 0.3$, and $0.01 \leq Z \leq 0.3$.

5. A magnetoresistive material comprising magnetic metallic thin film layers mainly composed of Ni-Co containing Ni not less than 50 atomic % with a thickness of 10 to 100Å, and non-magnetic metallic thin film layers mainly composed of Cu with thickness of about 20Å whereby the ratio of the resistance change, $\Delta R/R$, of the magnetoresistive material is a local maximum in a plot of $\Delta R/R$ versus the thickness of the Cu layer, both of the two kinds of layers being alternately laminated.

* * * * *